(12) United States Patent
Rogojina et al.

(10) Patent No.: US 7,727,901 B2
(45) Date of Patent: Jun. 1, 2010

(54) PREPARATION OF GROUP IV SEMICONDUCTOR NANOPARTICLE MATERIALS AND DISPERSIONS THEREOF

(75) Inventors: Elena V. Rogojina, Los Altos, CA (US); Manikandan Jayaraman, Sunnyvale, CA (US); Karel Vanheusden, Los Altos, CA (US)

(73) Assignee: Innovalight, Inc., Sunnyvale, CA (US)

( * ) Notice: Subject to any disclaimer, the term of this patent is extended or adjusted under 35 U.S.C. 154(b) by 0 days.

(21) Appl. No.: 12/112,640

(22) Filed: Apr. 30, 2008
(Under 37 CFR 1.47)

(65) Prior Publication Data

US 2009/0107359 A1 Apr. 30, 2009

Related U.S. Application Data

(60) Provisional application No. 60/915,817, filed on May 3, 2007.

(51) Int. Cl.
*H01L 21/302* (2006.01)
*H01L 21/461* (2006.01)
*A61K 6/00* (2006.01)

(52) U.S. Cl. .............. 438/752; 438/753; 438/754; 252/500; 29/825; 29/829; 424/401

(58) Field of Classification Search ........... 252/500
See application file for complete search history.

(56) References Cited

U.S. PATENT DOCUMENTS

| | | | |
|---|---|---|---|
| 5,800,611 A * | 9/1998 | Christensen | 117/68 |
| 5,989,700 A | 11/1999 | Krivopal | |
| 7,062,848 B2 | 6/2006 | Pan et al. | |
| 7,087,523 B2 | 8/2006 | Grigoropoulos et al. | |
| 7,572,740 B2 * | 8/2009 | Terry et al. | 438/752 |
| 2002/0149656 A1 | 10/2002 | Nohr et al. | |
| 2004/0096469 A1 * | 5/2004 | Lewis et al. | 424/401 |
| 2006/0154036 A1 | 7/2006 | Kunze et al. | |
| 2006/0157677 A1 | 7/2006 | Kunze et al. | |

(Continued)

FOREIGN PATENT DOCUMENTS

EP 0 417 294 3/1991

(Continued)

OTHER PUBLICATIONS

U.S. Appl. No. 60/921,710, filed Apr. 2007, Terry et al.*

(Continued)

*Primary Examiner*—Harold Y Pyon
*Assistant Examiner*—Timothy Chiang
(74) *Attorney, Agent, or Firm*—Foley & Lardner LLP

(57) ABSTRACT

A method of forming an ink, the ink configured to form a conductive densified film is disclosed. The method includes providing a set of Group IV semiconductor particles, wherein each Group IV semiconductor particle of the set of Group IV semiconductor particles includes a particle surface with a first exposed particle surface area. The method also includes reacting the set of Group IV semiconductor particles to a set of bulky capping agent molecules resulting in a second exposed particle surface area, wherein the second exposed particle surface area is less than the first exposed particle surface area. The method further includes dispersing the set of Group IV semiconductor particles in a vehicle, wherein the ink is formed.

16 Claims, 4 Drawing Sheets

U.S. PATENT DOCUMENTS

| | | |
|---|---|---|
| 2006/0197064 A1 | 9/2006 | Pan et al. |
| 2006/0237719 A1 | 10/2006 | Colfer et al. |
| 2007/0207307 A1* | 9/2007 | Yoneyama et al. ....... 428/313.5 |
| 2008/0160265 A1 | 7/2008 | Hieslmair et al. |
| 2008/0160733 A1 | 7/2008 | Hieslmair et al. |

FOREIGN PATENT DOCUMENTS

| | | |
|---|---|---|
| EP | 1 106 712 | 6/2001 |
| EP | 1 223 615 | 7/2002 |
| WO | WO 2004/040627 A2 | 5/2004 |
| WO | WO 2004/040627 A3 | 5/2004 |
| WO | WO 2004/068536 | 8/2004 |

OTHER PUBLICATIONS

Kim et al., "Thermal decomposition pathway and desorption study of isopropanol and *tert*-butanol on Si(100)," *J. Vac. Sci. Technol. A.*, vol. 20, No. 5, Sep.-Oct. 2002, pp. 1582-1586.

\* cited by examiner

PREPARATION OF GROUP IV SEMICONDUCTOR NANOPARTICLE MATERIALS AND DISPERSIONS THEREOF

CROSS-REFERENCE TO RELATED APPLICATIONS

This application claims priority to U.S. Provisional Patent Application No. 60/915,817 entitled "Preparation of Group IV Semiconductor Nanoparticle Materials and Dispersions Thereof," filed May 3, 2007, which is incorporated by reference.

FIELD OF DISCLOSURE

This disclosure relates to the preparation of Group IV semiconductor nanoparticles and preparation of stable dispersions of Group IV semiconductor nanoparticles.

BACKGROUND

The Group IV semiconductor materials enjoy wide acceptance as the materials of choice in a range of devices in numerous markets such as communications, computation, and energy. Currently, there is interest in using Group IV semiconductor nanoparticle materials in a wide range of components and devices.

For example, due to the luminescent properties of small nanoparticles, silicon and germanium nanoparticles have been contemplated for use in light-emitting applications, including use as phosphors for solid-state lighting, luminescent taggants for biological applications, security markers and related anti-counterfeiting measures. Other potential applications of Group IV semiconductor nanoparticles include a variety of optoelectronic devices, such as light-emitting diodes, photodiodes, photovoltaic cells, and sensors that utilize their unique optical and semiconductor properties. Because of the ability to produce colloidal forms of semiconductor nanoparticles, these materials offer the potential of low-cost processing, such as printing, for producing a variety of electronic devices that is not possible with conventional semiconductor materials. In that regard, tantamount to dispensing Group IV nanoparticle materials is not only the formulation of stable dispersions of the materials, which dispersions enable printing in a number of formats, but in formulations of inks which are suitable for the fabrication of a variety of optoelectric devices, such as photovoltaic devices.

In WO04068536A2 [Harting, et al.; International Patent Application No. WO2004IB00221, filing date Jan. 30, 2003] formulations of nanocrystalline silicon particles of about 30 nm in diameter, and formulated in a solvent-binder carriers are described. The nanoparticles were mixed with organic binders such as polystyrene in solvents such as chloroform to produce semiconductor inks that were printed on bond paper without further processing. In U.S. Patent Application Publication No. 2006/0154036 [Kunze, et al.; Ser. No. 11/373,696; filing date Mar. 10, 2006], composite sintered thin films of Group IV nanoparticles and hydrogenated amorphous Group IV materials are described. The Group IV nanoparticles are in the range 0.1 to 10 nm, in which the nanoparticles were passivated, typically using an organic passivation layer.

Additionally, a component in the ink formulation; a second cyclic Group IV compound, is a compound including organic ligands that are alkyl, aryl, or aralkyl ligands. In order to fabricate thin films from these organic passivated particles and carbon-containing cyclic compounds, the processing was performed at above 400° C. In both examples, significant amounts of organic materials are present in the inks used to fabricate Group IV thin film layers. Such organic-laden dispersions are known to be problematic in producing the well-accepted native Group IV semiconductor thin films known in the semiconductor industry.

U.S. Pat. No. 7,062,848 [Pan, et al.; Ser. No. 10/665,335; filing date Sep. 18, 2003] discloses a printable composition of nanoparticles composed of a liquid carrier, anisometric nanostructures, and in some embodiments, a stabilizing agent that reacts with the nanoparticles to produce a surface-attached ligand. The ligands are recited as being drawn from broad chemical classes, such as carboxylates, thiolates, alkoxides, alkanes, alkenes, alkynes, diketonates, siloxanes, silanes, germanes, hyroxides, hydrides, amides, amines, carbonyls, nitriles, aryl, and combinations thereof. Likewise, examples of the liquid carrier was drawn from broad chemical classes including hydrocarbons, alcohols, ethers, organic acids, esters, aromatics, amines, as well as water, and mixtures thereof. Though anisomeric silicon and germanium nanoparticles are recited as subject nanoparticles, there is no disclosure for how to prepare stable dispersions of such Group IV semiconductor nanoparticles, which dispersions are suitable for making a variety of optoelectric devices, such as photovoltaic devices. Moreover, two examples are given for preparation of printable compositions of zinc oxide; one of which is passivated using carboxylate compounds, and the other preparation of zinc oxide where the ligand is only described as hydrophilic for the purpose of being prepared as an aqueous dispersion.

In U.S. Patent Application Publication No. 2006/0237719 [Colfer, et al.; Ser. No. 10/533,291; filing date Oct. 30, 2003] though note is made of the problem of oxidation of Group IV semiconductor nanoparticles, nonetheless description is given for the preparation of Group IV semiconductor nanoparticles in aqueous dispersions containing about 30% of the surfactant polyethylene glycol (MW 200). In some embodiments, a capping ligand, such as octanol or a carboxylate terminal alkyl group is noted to assist in the dispersion of Group IV semiconductor nanoparticles in non-aqueous or aqueous solvents, though the preparation of dispersions of such capped Group IV semiconductor nanoparticles is not disclosed. Further, examples of the fabrication of a variety of optoelectric devices, such as photovoltaic devices, using such dispersions is not given.

Accordingly, there is a need in the art for the preparation of Group IV nanoparticle materials, and dispersions of such Group IV semiconductor nanoparticles materials that are suited for the fabrication of a variety of optoelectric devices, such as photovoltaic devices. Such dispersions are not only amenable to printing using a variety of techniques for a range of print dimensions ranging from sub-micron to meters, but enable the ready fabrication of semiconductor devices.

SUMMARY

The invention relates, in one embodiment, to a method of forming an ink, the ink configured to form a conductive densified film. The method includes providing a set of Group IV semiconductor particles, wherein each Group IV semiconductor particle of the set of Group IV semiconductor particles includes a particle surface with a first exposed particle surface area. The method also includes reacting the set of Group IV semiconductor particles to a set of bulky capping agent molecules resulting in a second exposed particle surface area, wherein the second exposed particle surface area is less than the first exposed particle surface area. The method further includes dispersing the set of Group IV semiconductor particles in a vehicle, wherein the ink is formed.

DETAILED DESCRIPTION

Embodiments of Group IV semiconductor nanoparticle inks formulated from Group IV semiconductor nanoparticles are disclosed herein. Various types of Group IV semiconductor nanoparticles may be utilized in the formulation of Group IV semiconductor inks. Examples include single or mixed elemental composition (including alloys, core/shell structures, doped nanoparticles, and combinations thereof), single or mixed shapes and sizes (and combinations thereof), and single form of crystallinity or a range or mixture of crystallinity (and combinations thereof). Such inks may be used in the fabrication of a range of optoelectric devices, on a variety of substrates using deposition methods such as, for example, but not limited by, roll coating, slot die coating, gravure printing, flexographic drum printing, and ink jet printing methods, or combinations thereof.

As previously mentioned, it is desirable to leverage the knowledge of Group IV semiconductor materials and at the same time exploit the advantages of Group IV semiconductor nanoparticles for producing novel thin film devices. The Group IV semiconductor nanoparticles, and the inks produced from them, must have properties that are suitable for producing high-quality Group IV semiconductor devices. Additionally, given the reactivity of the Group IV semiconductor nanoparticles, care must be taken from the point of synthesis of the Group IV semiconductor nanoparticles to avoid contamination known to be undesirable in semiconductor devices.

Figure 1:
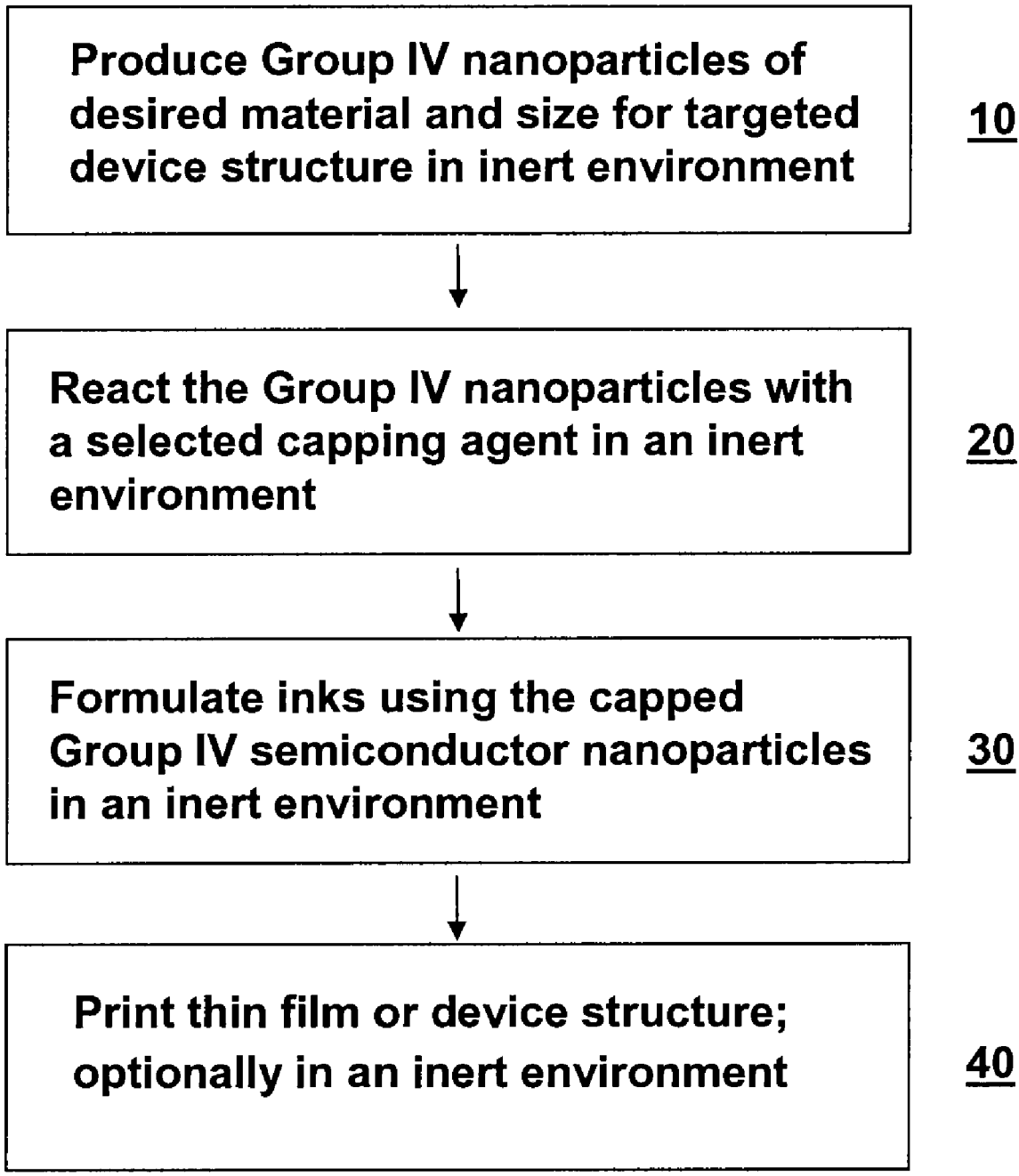
FIG. 1 is a flow chart depicting the process for making and printing embodiments of Group IV nanoparticle inks, in accordance with the invention.

FIG. 1 is a flow chart is shown for the preparation of Group IV semiconductor nanoparticle materials and inks, for the purpose of printing. In the first step 10, the preparation of Group IV semiconductor nanoparticles in an inert environment is indicated. Though any method of producing Group IV semiconductor nanoparticle materials in an inert environment may be used, gas phase methods for the preparation of Group IV semiconductor nanoparticles are exemplary of methods for producing high quality Group IV semiconductor nanoparticle materials in an inert environment. For example, U.S. patent application Ser. No. 11/155,340 (filing date Jun. 17, 2005), describes the preparation of Group IV semiconductor nanoparticles using an RF plasma apparatus, while U.S. Patent Application No. 60/878,328 (filing date Dec. 21, 2006) and U.S. Patent Application No. 60/901,768 (filing date Feb. 16, 2007) describe the gas phase preparation of doped Group IV semiconductor nanoparticle materials using an RF plasma apparatus. Additionally, U.S. Patent Application No. 60/920,471 (filing date Mar. 27, 2007) describes the use of a laser pyrolysis reactor for preparation of a variety of Group IV semiconductor nanoparticle materials. All of the aforementioned patent applications are incorporated by reference.

After the preparation of targeted Group IV semiconductor nanoparticle materials in step 10 of FIG. 1, the preparation of Group IV nanoparticle materials with a capping agent 20, followed by the formulation of the Group IV nanoparticle material with capping agent into inks in an inert environment in step 30 may be done. It is contemplated that desirable attributes for ink formulations for use in fabrication of a variety of optoelectric devices, such as photovoltaic devices, include, but are not limited by, prepared from Group IV nanoparticles of semiconductor grade, prepared in dispersions using materials that preserve the quality of the Group IV semiconductor nanoparticle starting materials, formulations that are readily adopted to a variety of printing technologies, and formulations of inks which show batch to batch consistency. With respect to the preparation of inks that preserve the quality of the Group IV semiconductor nanoparticle materials, it is desirable to avoid any processing that introduces contaminants, such as, but not limited by, metals, oxygen, and carbon, since it is known that such materials may be difficult to process out readily, and are known to introduce trap states into semiconductor devices.

For example, it is known that for bulk semiconductor materials, substantially free of oxygen falls in the range of about $10^{17}$ to $10^{19}$ oxygen atoms per cubic centimeter of Group IV semiconductor material. In comparison, for example, for semiconductor grade silicon, there are $5.0 \times 10^{22}$ silicon atoms per cubic centimeter, while for semiconductor grade germanium there are $4.4 \times 10^{22}$ germanium atoms per cubic centimeter. In that regard, oxygen can be no greater than about 2 parts per million to about 200 parts per million as a contaminant in Group IV semiconductor materials. Therefore, one example of a metric of "inert" is having Group IV semiconductor nanoparticle inks disclosed herein be formulated in an environment that provides a suitably low exposure of the nanoparticle starting materials and ink formulations to sources of oxygen, such as but not limited by oxygen; whether gas or dissolved in a liquid, and water; whether vapor or liquid, so that they can be further processed to produce devices that have comparable electrical and photoconductive properties in comparison to devices fabricated from traditional bulk Group IV semiconductor materials.

One aspect of insuring that embodiments of Group IV semiconductor inks are suitable for use in the fabrication of a variety of optoelectric devices is to prepare the Group IV semiconductor nanoparticle materials, the capped materials, and the ink formulations in inert environments, as shown in steps 10-30 and of FIG. 1. Though as previously discussed a substantially oxygen free environment is indicated in the fabrication and handling of the Group IV semiconductor nanoparticles, as used herein, "inert" is not limited to only substantially oxygen-free. It is recognized that other fluids (i.e. gases, solvents, and solutions) may react in such a way that they negatively affect the electrical and photoelectrical properties of Group IV semiconductor nanoparticles. Accordingly, an inert environment for the purposes of this disclosure is an environment in which there are no fluids (gases, solvents, and solutions) that react in such a way that they would negatively affect the electrical and photoelectrical properties of the Group IV semiconductor nanoparticles.

With respect to step 20 of FIG. 1, the objective of the preparation of formulations of Group IV semiconductor with capping agents is to minimize the incorporation of high levels of undesirable materials, as mentioned in the above, while preparing stable dispersions that can be used to produce semiconductor thin film devices. It is known by those of skill in the art that classes of organic compounds, such as alcohols, aldehydes, ketones, carboxylic acids, esters, and amines as well as organosiloxanes, may react with surface groups of Group IV semiconductor nanoparticle materials to form capping groups. However, the judicious selection of certain species within these broad classes, as well as the method of preparation of the inks formulations is clearly differentiating in formulating Group IV semiconductor nanoparticle inks that are useful in the fabrication of a variety of optoelectric devices, such as photovoltaic devices, as will be discussed in more detail subsequently.

In that regard, for the selection of species suitable for capping agents, for some embodiments of inks formulated using Group IV semiconductor nanoparticle materials. It is contemplated that capping agents having bulky substituents are suited to fabrication of semiconductor devices. Although not limited by theoretical explanation, capping agents with bulky substituents provide a greater surface excluded area once reacted with a surface Group IV semiconductor atom, and thereby limit the loading of the surface with capping groups. The synthetic strategy of such an approach is to limit surface loading. This may also be done using other strategies including the in situ capping of Group IV semiconductor nanoparticle materials, as will be discussed in more detail subsequently.

Another aspect of the selection of species suitable for capping agents is to provide adequate dispersion of the Group IV nanoparticle materials for printing. Still another aspect of the selection of suitable species for capping agents relates to the ease by which they may be removed in the process of fabrication of a semiconductor device. For example, bulky capping agents suitable for use in the preparation of capped Group IV semiconductor nanoparticles include C4-C8 branched alcohols, aldehydes, and ketones, such as tertiary-butanol, isobutanol, butanol, isobutanol, and oraganosiloxanes, such as methoxy(tris(trimethylsilyl)silane) (MTT-MSS), tris(trimethylsilyl)silane (TTMSS), decamethyltetrasiloxane (DMTS), and trimethylmethoxysilane (TMOS).

In terms of the selection of a vehicle, a suitable solvent or vehicle for use in printing Group IV semiconductor nanoparticles and fabricating them into a range of optoelectric devices is a solvent or vehicle that effectively disperses the capped Group IV nanoparticles, given properties such as viscosity, density, and polarity, and is also effectively removed in the fabrication of semiconductor devices. For example, as previously mentioned, vehicles may be selected from the same broad classes as the capping agents. In addition to the classes of chemicals previously described for capping agents and specific examples from those classes, such as alcohols, aldehydes, ketones, carboxylic acids, esters, amines, and organosiloxanes, hydrocarbon solvents may be good vehicles for dispersion of Group IV semiconductor nanoparticle ink formulations. For example, chloroform, chlorobenzene, and mesitylene are examples of hydrocarbon solvents which may be used as vehicles in the preparation of Group IV semiconductor inks. Additionally, vehicle blends of one or more solvents from the above named vehicles are desirable to achieve vehicle attributes such as Viscosity, density, and polarity, and the like.

In some embodiments, the reaction of the capping agent is done to ensure that only one species will react with the highly reactive surface groups on a Group IV semiconductor nanoparticle material before the capped material is dispersed in a vehicle. For example, as will be discussed in more detail subsequently, the reaction of bulky capping agents, such as t-butanol, is done in a separate step from the suspension of the capped particles in a vehicle, such as diethylene glycol diethyl ether (DEGDE), to insure that only the bulky t-butanol groups will cap the Group IV nanoparticle materials. In other embodiments, the capping agent and the vehicle may be the same chemical species. For example, isobutanol and DEGDE may both react with the surface as a capping agent, as well as disperse the capped Group IV semiconductor nanoparticle materials in an ink formulation. In still other embodiments, the capping agent and the vehicle may be selected from different chemical families. For example, when TMOS is the capping agent, chloroform is a suitable vehicle.

Figure 2A:
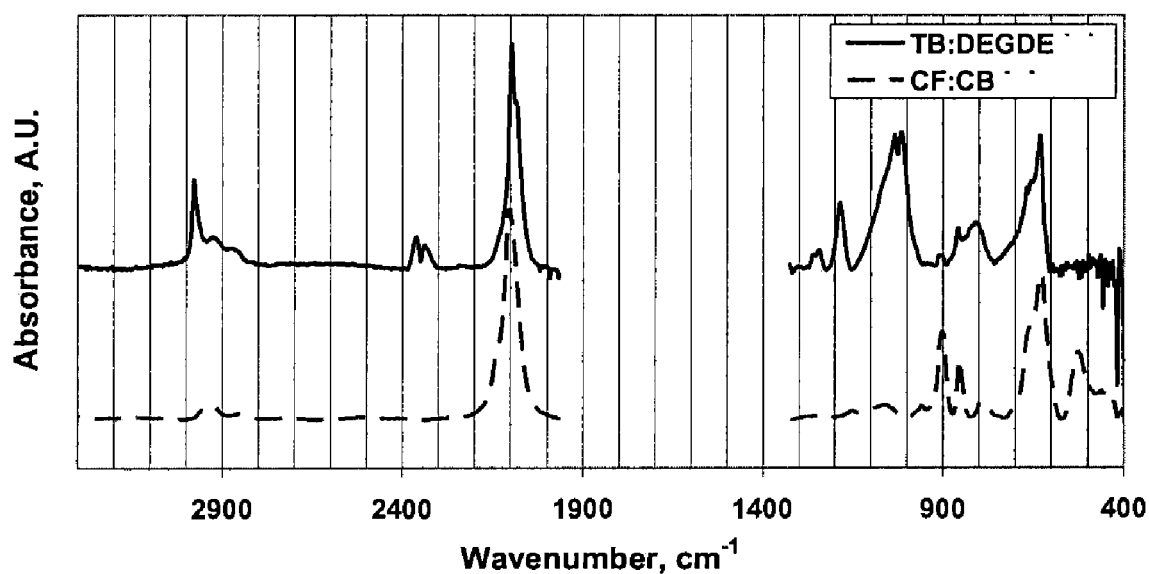
FIG. 2A-B are Fourier Transform Infrared (FTIR) spectra of two embodiments of Group IV nanoparticle inks in comparison with a composition of Group IV nanoparticles prepared in a mixture of chloroform and chlorobenzene, in accordance with the invention.
Figure 2B:
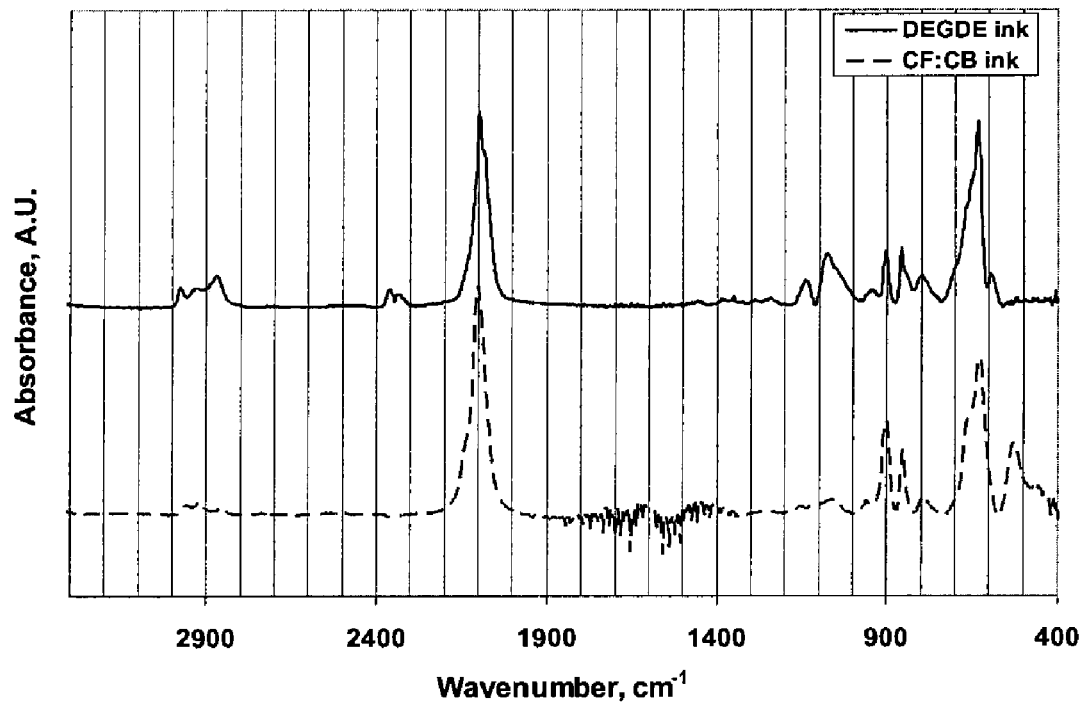

In FIG. 2A and FIG. 2B the Fourier Transform Infrared (FTIR) spectra of two preparations of Group IV nanoparticle inks, both in comparison with a preparation of a composition of Group IV nanoparticle in a low-boiling organic solvent mixture. In FIG. 2A, the FTIR spectrum shown in the top, solid line is for a silicon nanoparticle ink formulation, prepared using t-butanol ($C_4H_{10}O$), so that the silicon nanoparticles have a t-butoxy capping group, with the diethylene glycol diethyl either DEGDE ($C_8H_{18}O_3$) used as the vehicle to disperse the t-butoxy capped silicon nanoparticles. The lower hatched spectrum in FIG. 2A is a preparation of silicon nanoparticles in a solvent mixture of chloroform:chlorobenzene (3:1), used as a control. In FIG. 2B, the FTIR spectrum shown in the top solid line is an ink formulation of silicon nanoparticles with no t-butoxy capping agent, but suspended in DEGDE, which acts as both a capping reagent and a vehicle. The lower hatched spectrum in FIG. 2B is the control as described for FIG. 2A.

The t-butoxy-capped silicon nanoparticles of FIG. 2A were prepared using silicon nanoparticles of about 6.6 nm in diameter. The selection of t-butanol met the attributes of capping agents as outlined above. Typically, a formulation of silicon nanoparticles in t-butanol and DEGDE was prepared with a weight percentage ratio of 2 weight % silicon nanoparticles, 49 weight % t-butanol, and 49 weight % DEGDE. To prepare this formulation, the t-butanol and silicon nanoparticles were prepared by first mixing the constituents in a typical weight ratio of 5 weight % silicon nanoparticles to 95 weight % t-butanol, and then reacting the t-butanol with the silicon nanoparticles using either ultrasonication for about 15 minutes or heating at about 100° C. with stirring for about 30 minutes. For formulation of the capped Group IV semiconductor nanoparticles as a printable ink, this reacted mixture was subsequently dispersed in DEGDE in a volumetric ratio of between about 1:1 to about 1:3 of reacted mixture: DEGDE, and sonicated for about 15 minutes. The silicon nanoparticles of FIG. 2B were prepared using silicon nanoparticles of about 8.0 nm in diameter. The ink formulation was prepared by suspending the silicon nanoparticles in DEGDE in a weight percentage ratio of 2 weight % silicon nanoparticles to 98 weight % DEGDE, and mixed using ultrasonication for about 15 minutes. As previously mentioned, since the silicon atoms at the surface of the nanoparticles will react with ethers, the DEGDE is both a capping agent as well as a vehicle, and forms an ethoxyethyl ether bound capping group on the surface of the nanoparticles. All procedures carried out as described from the synthesis of the particles through the preparation of the inks in the above were done in an inert dry, oxygen-free environment, using solvents of the highest specifications.

The FTIR spectra in FIG. 2A shown using a solid line are the spectra of the 6.6 nm silicon nanoparticles prepared with a t-butoxy capping group in DEGDE as described above. These are compared in the hatched spectrum to the same batch of nanoparticles prepared as a 20 mg/ml solution in chloroform:chlorobenzene (4:1). For the silicon nanoparticles prepared using the t-butanol capping reagent, the peak at about 2990 cm-1 with shoulder at about 2910 cm-1 is indicative of alkyl carbonhydrogen stretch, and is a signature of the methyl groups. The broad doublet peak which appears between about 950 cm-1 to about 1150 cm-1 is the signature for an Si—O—C moiety, and confirms that the t-butoxy group is surface bound to the silicon nanoparticles. In comparison to the silicon nanoparticles prepared as a composition in the chloroform:chlorobenzene (341) solution, these features are clearly absent.

The FTIR spectra in FIG. 2B shown using a solid line is the spectra of the 8.0 nm silicon nanoparticles prepared with DEGDE acting as both the capping reagent, well as the vehicle as described above, which are compared in the hatched spectrum to the same batch of nanoparticles prepared as a 20 mg/ml solution in chloroform:chlorobenzene (3:1). For the silicon nanoparticles prepared using a linear chain ether as a capping agent, the prominent doublet between about 2880 cm$^{-1}$ to about 3000 cm$^{-1}$ is indicative of ethyl carbon-hydrogen stretch. The broad peak which appears between about 1000 cm$^{-1}$ to about 1200 cm$^{-1}$ is the signature for a Si—O—C mode, and confirms that an ethoxyethyl ether group is surface bound to the silicon nanoparticles. In comparison to the silicon nanoparticles prepared as a composition in the chloroform:chlorobenzene (3:1) solution, these features are clearly absent.

Figure 3A:
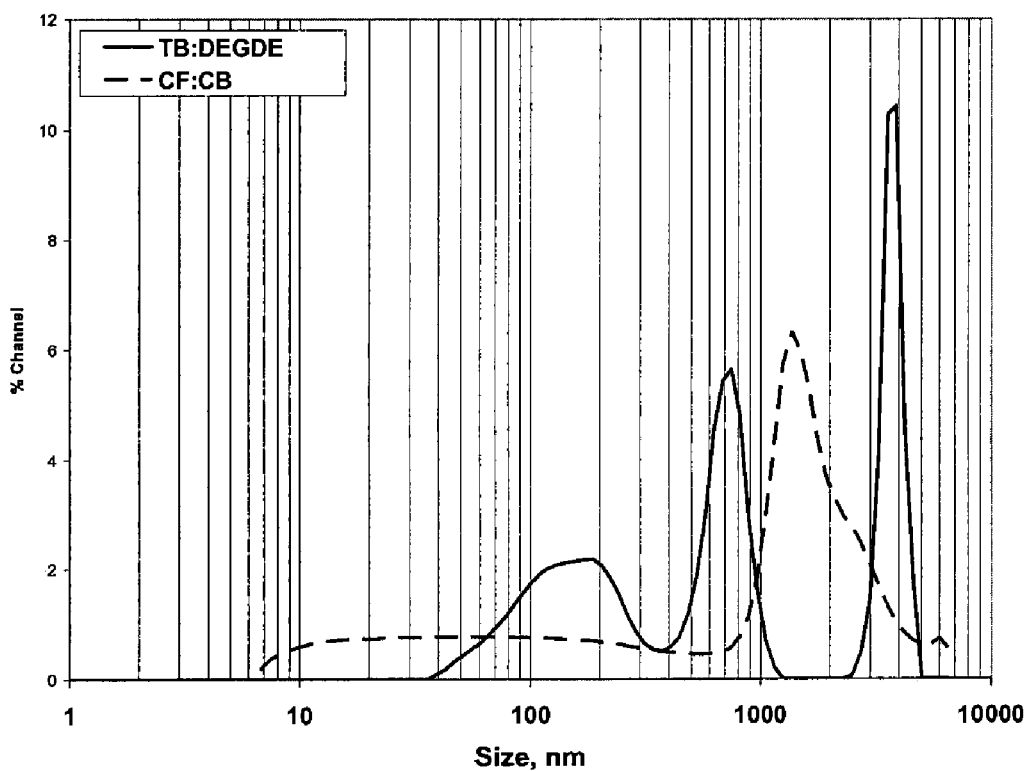
FIG. 3A-B depict the light scattering size distribution determinations of two embodiments of Group IV nanoparticle inks in comparison with a composition of Group IV nanoparticles prepared in a mixture of chloroform and chlorobenzene, in accordance with the invention.
Figure 3B:
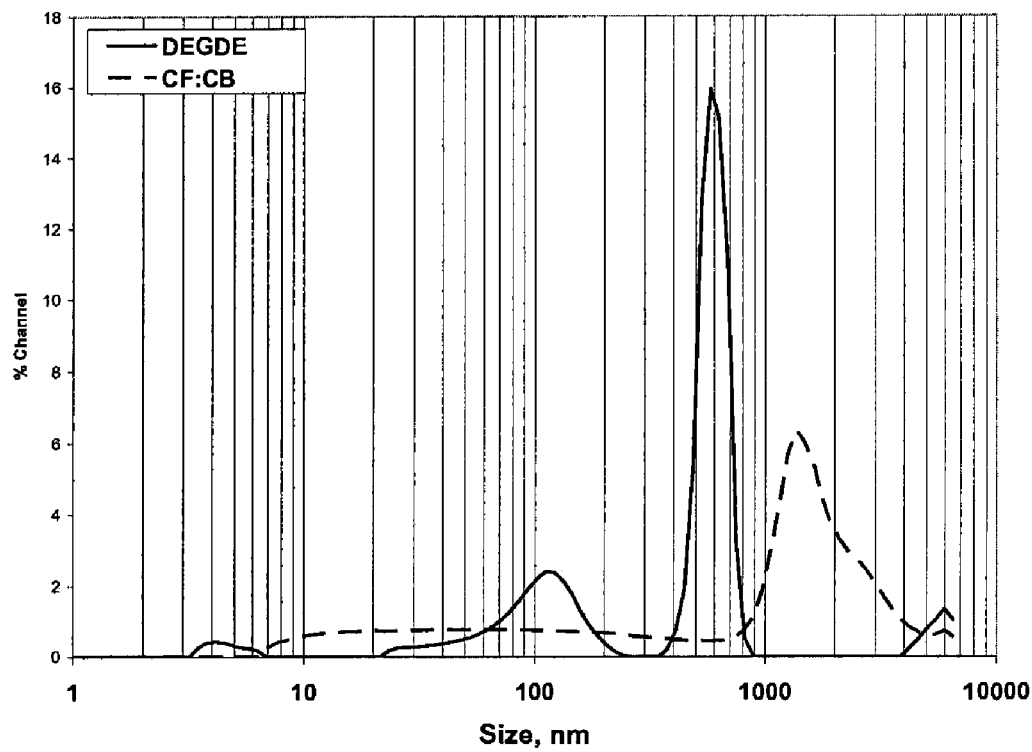

FIG. 3A and FIG. 3B show the results of the particle size distribution analysis using light scattering of the two formulations of inks versus the control. In FIG. 3A, the solid line representing a trimodal distribution of particle distribution for the t-butoxy capped silicon nanoparticles, shows a population silicon nanoparticle agglomerates at about 3.9 microns, another a population silicon nanoparticle agglomerates at about 850 nm, and a broadly dispersed population at about 150 nm. For the ethoxyethyl ether capped silicon nanoparticles represented by the solid line in FIG. 3B, a bimodal distribution is indicated, showing a major of silicon nanoparticle agglomerates at about 800 nm, and a minor peak at about of silicon nanoparticle agglomerates 125 nm. In both instances, the dispersions were stable, and proved suitable for ink jet printing. As one of skill in the art of printing is apprised, ink jet printing is a good bench mark for a printable formulation, since such formulations may be easily adjusted to a range of formats of other printing technologies. Additionally, ink jet printing allows a range of scale of printing from sub-micron to meters. The hatched line shown in both FIG. 3A and FIG. 3B represents the control composition of silicon nanoparticles in chloroform:chlorobenzene (3:1), which shows a broad distribution of silicon nanoparticle agglomerates at about 1.5 micron. It should be noted that the silicon nanoparticles are not a stable dispersion in the chloroform:chlorobenzene solution, and settle out within a day. This is in contrast to the stable ink formulations of the t-butoxy capped silicon nanoparticles in DEGDE, and the ethoxyethyl ether capped silicon nanoparticles in DEGDE.

Although both inks show that the nanoparticles are in populations of agglomerates, it should be noted that, as indicated in FIG. 1, step 10 the Group IV semiconductor nanoparticles are produced as high quality material, without signs of soft or hard agglomeration. This was demonstrated in a first transmission electron micrograph (TEM) of silicon nanoparticles of high quality made in an inert environment, as per step 10 of FIG. 1. In this TEM image, the particles appear to have an average diameter of about 10.0 nm, clearly have the morphology of distinct particles, and appear to be fairly monodispersed.

In contrast, in second TEM image of a commercially available preparation of silicon nanoparticles, considerable fusion is between particles evident, in which networks of amorphous material bridge nanoparticle material. Upon careful inspection, it can also be seen that very small particles are fused with fairly large particles, so that polydispersity is also evident in this sample. Embodiments of ink formulations disclosed herein are prepared with materials, such as the silicon nanoparticles, so that the populations of agglomerates in the ink formulations as shown in FIG. 3A and FIG. 3B are not formed from nanoparticle materials suffering from hard agglomerates.

EXAMPLE

A first thin film was produced using an ink formulation as previously described, in which silicon nanoparticles are capped with t-butoxy groups dispersed in DEGDE, while a second thin film was produced using an ink formulation as previously described, in which silicon nanoparticles are capped ethoxyethyl ether groups dispersed in DEGDE.

For the preparation of the first and second thin films, the substrate used was a 1"×1"×0.2" silicon (100) substrate, which was doped with boron with a resistivity of about 10~20 ohm-cm. Two layers of silicon nanoparticles were printed on the substrate with the respective inks, as described above. The deposited silicon nanoparticle thin films were processed in vacuo in a fabrication chamber having a top and bottom heating element, which were controlled to the same target temperatures. In a first preconditioning step, the samples were subjected to 350° C. using a 15-minute ramp to the target temperature, followed by a 10-minute hold. During the following fabrication step, the samples were ramped to 805° C., and held at that temperature for 6 minutes.

In a first set of SEM (scanning electron microscopy) images, it was observed that the t-butoxy/DEGDE capping group/vehicle formulation produces a densified film having large grains. In contrast, the ethoxyethyl ether/DEGDE formulation produces a densified film in which the grain growth is clearly limited. The butoxy/DEGDE capping group/vehicle formulation is believed to be effective in the fabrication of a Group IV semiconductor thin film due to the limitation of the surface loading of the bulky group, as well as the substantial removal of these groups in the preprocessing step, before thin film fabrication, leaving only a small residual to be removed during the fabrication step. Clearly, while both the t-butoxy/DEGDE capping group/vehicle formulation and the ethoxyethyl ether/DEGDE formulation are printable compositions of Group IV semiconductor inks, both do not produce a densified Group IV semiconductor thin film under comparable fabrication conditions.

In that regard, these results show the impact of matching the attributes of a printable composition of a Group IV semiconductor ink to the choice of capping agent and vehicle, and how the method of formulation of the ink impacts the fabrication of a Group IV semiconductor thin film. Clearly, in addition to the preparation of quality Group IV nanoparticle materials in an inert environment as per 10 of FIG. 1, the method of making the surface-capped Group IV nanoparticle materials in an inert environment, with proper selection and preparation of the capping reagent as per 20 of FIG. 1, along with formulation of an ink in an inert environment using the proper selection of the vehicle as per 30 of FIG. 1 is differentiating. Such steps in the formulation of a Group IV nanoparticle ink are indicated in light of the extraordinary reactivity of the Group IV nanoparticle surface groups to a variety of chemical species.

Figure 4A:
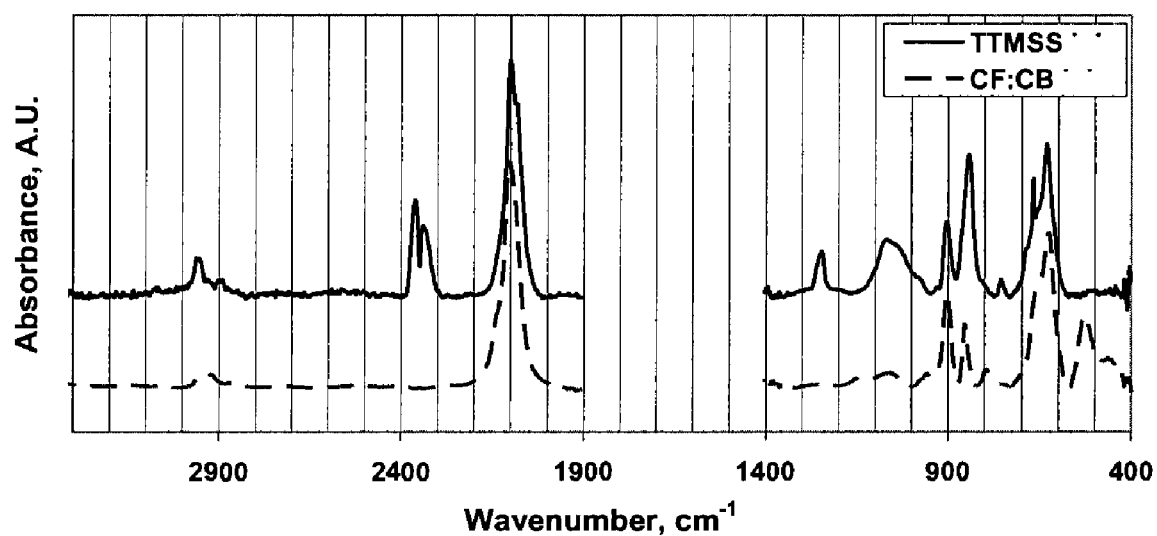
FIG. 4A-B depict the Fourier Transform Infrared (FTIR) spectra of an embodiment of a Group IV nanoparticle ink (FIG. 4A), and the light scattering size distribution determination of the embodiment (FIG. 4B).
Figure 4B:
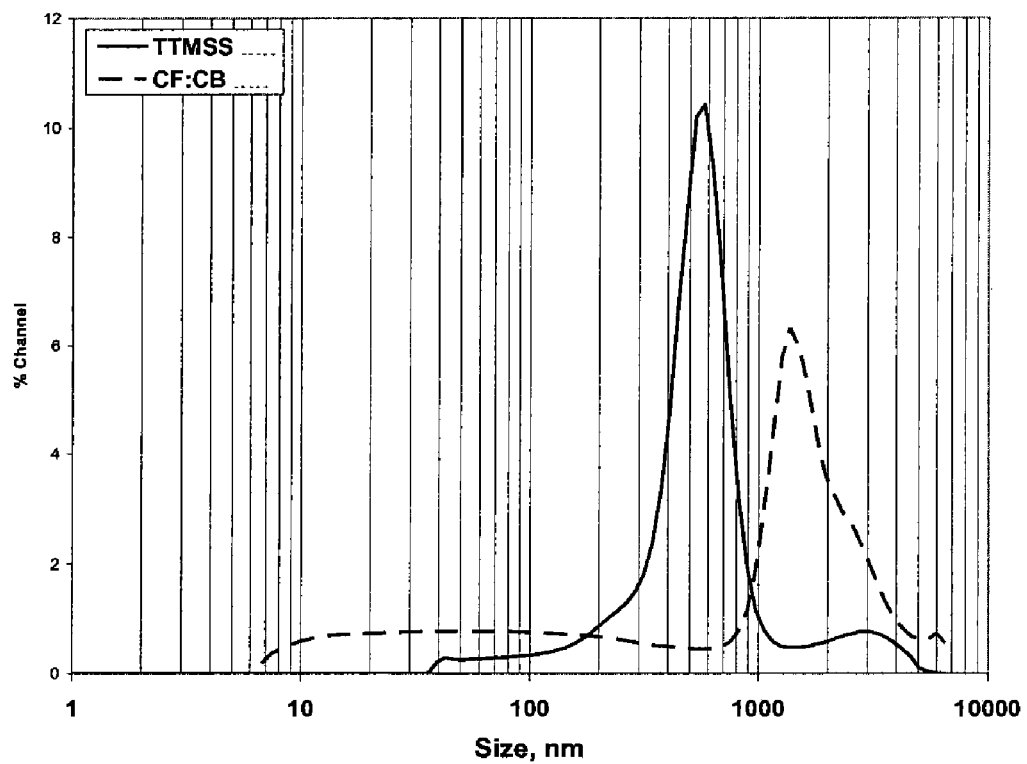

FIG. 4A-B are FTIR spectra (FIG. 4A), as well as the particle size distribution analysis using light scattering (FIG. 4B) for another example of an embodiment of a Group IV semiconductor ink that produce densified Group IV semiconductor thin films. The Group IV semiconductor nanoparticles are silicon nanoparticles of about 6 nm in diameter, and the capping reagent in this example is selected from organosiloxanes of the general formula:

where n=1-3; and R, R' are selected from alkyl, aryl, and aralkyl

In this example, the organosiloxane capping agent is methoxy(tris(trimethylsilyl)silane), or MTTMSS, and the vehicle is (tris(trimethylsilyl)silane), or TTMSS, The MTTMSS, like the t-butanol capping reagent, has bulky substituents. As seen in the FTIR spectra of nanoparticles prepared using the MTTMSS capping agent in FIG. 6A (solid line), the signature of the methyl groups at between about 2800 cm−1 to about 3000 cm−1 on the surface of the silicon nanoparticles is evident. The broad peak centered at about 1070 cm−1 indicates the presence of an Si—O—Si group. These features are absent in the control spectrum represented by the hatched line, which represents silicon nanoparticles prepared as a composition in the chloroform:chlorobenzene (4:1) solution. In FIG. 4B, particle size distribution data indicate a dominant peak at about 600 nm.

Further, the densified thin film 120 was fabricated from printed thin films deposited on the substrate using an embodiment of the MTTMSS capping agent/TTMSS vehicle Group IV semiconductor ink. In the preparation of the thin film shown in FIG. 4A-B, the substrate 110 used was a 1"×1"×0.2" silicon (100) substrate, which was doped with boron with a resistivity of about 10 ohm·cm. Two layers of silicon nanoparticles were printed on the substrate with the ink, as described above. The deposited silicon nanoparticle thin films were processed in vacuo in a fabrication chamber having a top and bottom heating element, which were controlled to the same target temperatures. During the fabrication step after the application of the first layer of silicon nanoparticles, the samples were ramped to 805° C. over 14 minutes, and held at that temperature for 6 minutes. The samples were then mechanically and chemically cleaned, a second layer of silicon nanoparticles was printed, and the same fabrication steps as described for the fabrication of the first thin film layer were applied. It was observed that the fabricated silicon thin film 120 was densified to a degree that it is indistinguishable in appearance from the silicon substrate 110.

Finally, as one of ordinary skill in the art is apprised, the surface loading of capping groups may also be controlled through other approaches, such as, but not limited by stoichiometric control. Additionally, though solution approaches to capping is given in the above examples, in situ capping is also contemplated. Using in situ capping it is possible to produce a variety of surface-capped Group IV nanoparticle materials. Apparatuses and methods for in situ modification of Group IV nanoparticle materials are given in U.S. Patent Application No. 60/881,869 (filing date Jan. 22, 2007) the entirety of which is incorporated by reference.

While principles of the disclosed Group IV semiconductor nanoparticle inks have been described in connection with specific embodiments, it should be understood clearly that these descriptions are made only by way of example and are not intended to limit the scope of what is disclosed. In that regard, what has been disclosed herein has been provided for the purposes of illustration and description. It is not intended to be exhaustive or to limit what is disclosed to the precise forms described. Many modifications and variations will be apparent to the practitioner skilled in the art. What is disclosed was chosen and described in order to best explain the principles and practical application of the disclosed embodiments of the art described, thereby enabling others skilled in the art to understand the various embodiments and various modifications that are suited to the particular use contemplated. It is intended that the scope of what is disclosed be defined by the following claims and their equivalence.

What is claimed is:

1. A method of forming an ink, comprising:
providing a set of Group IV semiconductor nanoparticles, wherein each Group IV semiconductor nanoparticle of the set of Group IV semiconductor nanoparticles includes a nanoparticle surface with a first exposed nanoparticle surface area;
reacting the set of Group IV semiconductor nanoparticles to a set of bulky capping agent molecules resulting in a second exposed nanoparticle surface area, wherein the second exposed nanoparticle surface area is less than the first exposed nanoparticle surface area; and
dispersing the set of Group IV semiconductor nanoparticles in a vehicle;
wherein the ink is formed,
further wherein the ink and the bulky capping agent molecules are adapted to provide a densified film from the ink, the densified film suitable for use in an optoelectronic device,
and further wherein the step of reacting the set of Group IV semiconductor nanoparticles to a set of bulky capping agent molecules further includes:
mixing about 5 weight % of the set of Group IV semiconductor nanoparticles with the set of bulky capping agent nanoparticles to create a first mixture; and
exposing the first mixture to ultrasonication for about 15 minutes in order to create a second mixture.

2. The method of claim 1, wherein the set of bulky capping agent molecules includes at least one of an alcohol, an aldehyde, a ketone, or an organosiloxane.

3. The method of claim 1, wherein the vehicle includes at least one of an alcohol, an aldehyde, a ketone, a carboxylic acid, an ester, an amine, an organosiloxane, or a hydrocarbon.

4. A method of forming an ink, comprising:
providing a set of Group IV semiconductor nanoparticles, wherein each Group IV semiconductor nanoparticle of the set of Group IV semiconductor nanoparticles includes a nanoparticle surface with a first exposed nanoparticle surface area;
reacting the set of Group IV semiconductor nanoparticles to a set of bulky capping agent molecules resulting in a second exposed nanoparticle surface area, wherein the second exposed nanoparticle surface area is less than the first exposed nanoparticle surface area; and
dispersing the set of Group IV semiconductor nanoparticles in a vehicle;
wherein the ink is formed,
and further wherein the step of reacting the set of Group IV semiconductor nanoparticles to a set of bulky capping agent molecules further includes:

mixing about 5 weight % of the set of Group IV semiconductor nanoparticles with the set of bulky capping agent nanoparticles to create a first mixture; and exposing the first mixture to ultrasonication for about 15 minutes in order to create a second mixture, and further wherein the step of dispersing the set of Group IV semiconductor nanoparticles in a vehicle further includes:

dispersing the second mixture in the vehicle in a volumetric ratio of between about 1:1 to about 1:3 of second mixture:vehicle to create a third mixture; and sonicating the third mixture for about 15 minutes.

5. A method of forming an ink, comprising:

providing a set of Group IV semiconductor nanoparticles, wherein each Group IV semiconductor nanoparticle of the set of Group IV semiconductor nanoparticles includes a nanoparticle surface with a first exposed nanoparticle surface area;

reacting the set of Group IV semiconductor nanoparticles to a set of bulky capping agent molecules resulting in a second exposed nanoparticle surface area, wherein the second exposed nanoparticle surface area is less than the first exposed nanoparticle surface area; and dispersing the set of Group IV semiconductor nanoparticles in a vehicle;

wherein the ink is formed, and further wherein the step of reacting the set of Group IV semiconductor nanoparticles to a set of bulky capping agent molecules further includes:

mixing about 5 weight % of the set of Group IV semiconductor nanoparticles with the set of bulky capping agent nanoparticles to create a first mixture; and heating the first mixture at about 100° C. with stirring for about 30 minutes to create a second mixture.

6. The method of claim 5, wherein the step of dispersing the set of Group IV semiconductor nanoparticles in a vehicle further includes:

dispersing the second mixture in the vehicle in a volumetric ratio of between about 1:1 to about 1:3 of second mixture:vehicle to create a third mixture; and sonicating the third mixture for about 15 minutes.

7. The method of claim 2, wherein the set of bulky capping agent molecules comprises alkyl groups with at least one of a C4-C8 straight chain structure or a C4-C8 branched structure.

8. The method of claim 1, wherein the step of reacting the set of Group IV semiconductor nanoparticles, the step of dispersing the set of Group IV semiconductor nanoparticles in a vehicle, or both, is conducted in an inert environment.

9. The method of claim 1, wherein the set of bulky capping agent molecules comprises tertiary-butanol, isobutanol, butanol, diethylene glycol diethyl ether, methoxy(tris(trimethylsilyl)silane), tris(trimethylsilyl)silane, decamethyltetrasiloxane, or trimethylmethoxysilane.

10. The method of claim 1, wherein the vehicle comprises chloroform, chlorobenzene, mesitylene, diethylene glycol diethyl ether, or tris(trimethylsilyl)silane.

11. The method of claim 1, wherein the set of bulky capping agent molecules comprises tertiary-butanol and the vehicle comprises diethylene glycol diethyl ether.

12. The method of claim 1, wherein the set of bulky capping agent molecules comprises diethylene glycol diethyl ether and the vehicle comprises diethylene glycol diethyl ether.

13. The method of claim 1, wherein the set of bulky capping agent molecules comprises methoxy(tris(trimethylsilyl)silane) and the vehicle comprises tris(trimethylsilyl)silane.

14. The method of claim 1, further comprising:

depositing the ink on a substrate;

heating the deposited ink to a first temperature sufficient to remove the bulky capping agent molecules from the Group IV semiconductor nanoparticles; and heating the deposited ink to a second temperature sufficient to provide the densified film.

15. The method of claim 14, wherein the first temperature is about 350° C.

16. The method of claim 14, wherein the second temperature is about 805° C.

* * * * *